(12) United States Patent
Moon et al.

(10) Patent No.: US 12,302,638 B2
(45) Date of Patent: May 13, 2025

(54) MANUFACTURING METHOD OF ORGANIC LIGHT EMITTING DIODE DISPLAY DEVICE HAVING MULTILAYER CONDUCTIVE LAYER

(71) Applicant: Samsung Display Co., LTD., Yongin-si (KR)

(72) Inventors: Sang-Ho Moon, Cheonan-si (KR); Chun Gi You, Asan-si (KR); Tae Kon Kim, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/899,554

(22) Filed: Aug. 30, 2022

(65) Prior Publication Data
US 2022/0415984 A1   Dec. 29, 2022

Related U.S. Application Data

(62) Division of application No. 16/848,481, filed on Apr. 14, 2020, now Pat. No. 11,462,601.

(30) Foreign Application Priority Data

Jun. 19, 2019   (KR) ........................ 10-2019-0072844

(51) Int. Cl.
*H10K 59/123*     (2023.01)
*H10D 86/40*      (2025.01)
(Continued)

(52) U.S. Cl.
CPC ......... *H10D 86/423* (2025.01); *H10K 50/814* (2023.02); *H10K 59/1213* (2023.02);
(Continued)

(58) Field of Classification Search
CPC .. H10K 71/00; H10K 59/1201; H10K 71/231; H10K 59/123; H10K 59/1213;
(Continued)

(56) References Cited

U.S. PATENT DOCUMENTS 8,420,423 B2   4/2013   Choi et al.
9,478,742 B2   10/2016  Takagi et al.
(Continued)

FOREIGN PATENT DOCUMENTS

CN    106876426 A      6/2017
KR    1020000010707 A  2/2000
(Continued)

*Primary Examiner* — Eliseo Ramos Feliciano
*Assistant Examiner* — Mikka Liu
(74) *Attorney, Agent, or Firm* — CANTOR COLBURN LLP

(57) ABSTRACT

An organic light emitting diode display includes a substrate, a semiconductor layer disposed on the substrate, a first insulating layer which covers the semiconductor layer, a first conductive layer disposed on the first insulating layer, a second insulating layer which covers the first conductive layer, a second conductive layer disposed on the second insulating layer, a third insulating layer which covers the second conductive layer, a third conductive layer disposed on the third insulating layer, a first organic layer which covers the third conductive layer, and a fourth conductive layer disposed on the first organic layer, where the fourth conductive layer includes a lower layer, a middle layer, and an upper layer, and the lower layer is disposed between the first organic layer and the middle layer, and includes a transparent conductive oxidization film.

6 Claims, 14 Drawing Sheets

(51) Int. Cl.
*H10K 50/814* (2023.01)
*H10K 59/121* (2023.01)
*H10K 59/131* (2023.01)
*H10K 71/00* (2023.01)
*H10K 71/20* (2023.01)
*H10D 30/67* (2025.01)
*H10D 86/01* (2025.01)
*H10D 86/60* (2025.01)
*H10K 59/12* (2023.01)

(52) U.S. Cl.
CPC ....... *H10K 59/1216* (2023.02); *H10K 59/123* (2023.02); *H10K 59/131* (2023.02); *H10K 71/00* (2023.02); *H10K 71/231* (2023.02); *H10D 30/6755* (2025.01); *H10D 86/021* (2025.01); *H10D 86/441* (2025.01); *H10D 86/481* (2025.01); *H10D 86/60* (2025.01); *H10K 59/1201* (2023.02)

(58) Field of Classification Search
CPC .............. H10K 59/131; H01L 27/1259; H01L 27/1225; H01L 27/1255
See application file for complete search history.

(56) References Cited

U.S. PATENT DOCUMENTS

| | | |
|---|---|---|
| 9,711,588 B2 | 7/2017 | Han et al. |
| 10,090,370 B2 | 10/2018 | Lee et al. |
| 10,396,143 B2 | 8/2019 | Han et al. |
| 10,522,780 B2 | 12/2019 | Ahn et al. |
| 10,755,635 B2 | 8/2020 | Yang et al. |
| 10,854,699 B2 | 12/2020 | Lee et al. |
| 2005/0048706 A1 | 3/2005 | Shimomura et al. |
| 2008/0135851 A1* | 6/2008 | Kim .................. G02F 1/13318 257/E27.111 |
| 2014/0367689 A1 | 12/2014 | Cho et al. |
| 2016/0013436 A1* | 1/2016 | Im .......................... H10K 50/824 257/40 |
| 2016/0141339 A1 | 5/2016 | Prushinskiy et al. |
| 2016/0336386 A1* | 11/2016 | Saito .................... H01L 27/1225 |
| 2016/0351846 A1 | 12/2016 | Kim et al. |
| 2017/0062548 A1 | 3/2017 | Han et al. |
| 2017/0213871 A1* | 7/2017 | Chen ...................... H10K 59/35 |
| 2018/0062105 A1 | 3/2018 | Lius et al. |
| 2019/0006442 A1 | 1/2019 | Byun et al. |
| 2019/0019441 A1 | 1/2019 | Shin et al. |
| 2019/0043927 A1 | 2/2019 | Jang et al. |
| 2019/0189727 A1 | 6/2019 | Kim et al. |
| 2020/0144309 A1 | 5/2020 | Jeon et al. |

FOREIGN PATENT DOCUMENTS

| | | |
|---|---|---|
| KR | 1020110109048 A | 10/2011 |
| KR | 1020140083106 | 7/2014 |
| KR | 1020150026883 A | 3/2015 |
| KR | 1020150081869 A | 7/2015 |
| KR | 1020160074333 A | 6/2016 |
| KR | 1020160141315 A | 12/2016 |
| KR | 1020170012767 | 2/2017 |
| KR | 1020170025548 A | 3/2017 |
| KR | 1020180015688 | 2/2018 |
| KR | 1020180043434 A | 4/2018 |
| KR | 101893844 | 9/2018 |
| KR | 1020190028587 | 3/2019 |
| KR | 1020190028589 | 3/2019 |
| KR | 1020190036578 A | 4/2019 |
| KR | 1020190051513 A | 5/2019 |

\* cited by examiner

MANUFACTURING METHOD OF ORGANIC LIGHT EMITTING DIODE DISPLAY DEVICE HAVING MULTILAYER CONDUCTIVE LAYER

This application is a divisional of U.S. patent application Ser. No. 16/848,481, filed on Apr. 14, 2020, which claims priority to Korean Patent Application No. 10-2019-0072844 filed on Jun. 19, 2019, and all the benefits accruing therefrom under 35 U.S.C. § 119, the content of which in its entirety is herein incorporated by reference.

BACKGROUND

(a) Field

Exemplary embodiments of the invention relate to an organic light emitting diode display and a manufacturing method thereof, and particularly relate to an organic light emitting diode display including a multilayered electrode and a manufacturing method thereof.

(b) Description of the Related Art

A display device displays images, and recently, an organic light emitting diode display has been paid high attention.

The organic light emitting diode display has a self-emission characteristic, and it desires no additional light source, differently from liquid crystal display devices, thereby reducing a thickness and a weight thereof. Further, the organic light emitting diode display has high-quality characteristics such as low power consumption, high luminance, and high reaction speed.

SUMMARY

An organic light emitting diode display has a more complicated pixel configuration than the liquid crystal display device, and forms an electrode by use of a plurality of masks. In this instance, when the electrode is formed on an organic layer, a substrate may be contaminated and a yield may become worse because of particles of the organic layer generated in reaction with an etching gas in a dry etching process.

Exemplary embodiments of the invention have been made in an effort to provide an organic light emitting diode display for preventing an exposed portion of an organic layer from reacting with an etching gas and generating particles in a dry etching process when an electrode is formed on an organic layer, and a manufacturing method thereof.

An exemplary embodiment of the invention provides an organic light emitting diode display including a substrate, a semiconductor layer disposed on the substrate, a first insulating layer which covers the semiconductor layer, a first conductive layer disposed on the first insulating layer, a second insulating layer which covers the first conductive layer, a second conductive layer disposed on the second insulating layer, a third insulating layer which covers the second conductive layer, a third conductive layer disposed on the third insulating layer, a first organic layer which covers the third conductive layer, and a fourth conductive layer disposed on the first organic layer, where the fourth conductive layer includes a lower layer, a middle layer, and an upper layer, and the lower layer is disposed between the first organic layer and the middle layer, and includes a transparent conductive oxidization film.

In an exemplary embodiment, the transparent conductive oxidization film may include at least one of indium tin oxide ("ITO"), indium zinc oxide ("IZO"), indium gallium zinc oxide ("IGZO"), and indium tin zinc oxide ("ITZO").

In an exemplary embodiment, the middle layer may include aluminum (Al), and the upper layer may include titanium (Ti).

In an exemplary embodiment, the middle layer or the upper layer may further include a layer including titanium nitride (TiN).

In an exemplary embodiment, the middle layer may include a layer including titanium nitride between the aluminum and the lower layer, and the upper layer may further include a layer including titanium nitride on the titanium.

In an exemplary embodiment, the organic light emitting diode display may further include a second organic layer which covers a fourth conductive layer, and an anode disposed on a second organic layer.

In an exemplary embodiment, the organic light emitting diode display may further include a driving transistor disposed on the substrate, where the driving transistor may include a first semiconductor disposed in a same layer as the semiconductor layer, and including a channel region, a source region, and a drain region, and a driving gate electrode disposed in a same layer as the first conductive layer, and a source electrode connected to the source region of the first semiconductor and a drain electrode connected to the drain region.

In an exemplary embodiment, the organic light emitting diode display may further include a second thin film transistor for transmitting a data voltage to a source electrode of the driving transistor, and a third thin film transistor for initializing a drain electrode of the driving transistor.

In an exemplary embodiment, the fourth conductive layer may further include a data line for transmitting a data voltage to the second thin film transistor, and extending in a first direction in a plan view, a driving voltage line for transmitting a driving voltage to the driving transistor, and extending in the first direction in the plan view, and an initialization voltage line for transmitting an initialization voltage to the third thin film transistor, and extending in the first direction in the plan view.

In an exemplary embodiment, the semiconductor layer may include a horizontal initialization voltage line extending in a second direction crossing the first direction in the plan view, and transmitting the initialization voltage in the second direction.

In an exemplary embodiment, the second conductive layer may include a horizontal driving voltage line extending in a second direction crossing the first direction in the plan view, and transmitting the driving voltage in the second direction, and a repair line disposed in a first direction parallel to the horizontal driving voltage line, and the repair line may overlap a part of the horizontal driving voltage line in the plan view.

In an exemplary embodiment, the first conductive layer may include an emission control signal line extending in a second direction crossing the first direction in the plan view, and transmitting an emission control signal.

In an exemplary embodiment, the third conductive layer may include a scan line extending in a second direction crossing the first direction in the plan view, and transmitting a scan signal to the second thin film transistor and the third thin film transistor, a previous-stage scan line extending in a second direction crossing the first direction in the plan view, and transmitting a scan previous-stage signal, and a bypass control line extending in a second direction crossing the first direction in the plan view, and transmitting a bypass signal.

Another exemplary embodiment of the invention provides a method for manufacturing an organic light emitting diode display, including providing a substrate, forming an inorganic insulating layer on the substrate, forming a third conductive layer on the inorganic insulating layer, forming a first organic layer on the third conductive layer, and forming a fourth conductive layer on the first organic layer, where the forming the fourth conductive layer includes at least one of a dry etching process and a wet etching process.

In an exemplary embodiment, the forming the fourth conductive layer may further include forming a transparent conductive oxidization film on the first organic layer, and forming a plurality of metal layers on the transparent conductive oxidization film.

In an exemplary embodiment, the plurality of metal layers may be etched by the dry etching process to form a middle layer and an upper layer of the fourth conductive layer.

In an exemplary embodiment, the plurality of metal layers may include at least one of aluminum (Al), titanium (Ti), and titanium nitride (TiN), the middle layer may include the aluminum, and the upper layer may further include at least one of titanium and titanium nitride.

In an exemplary embodiment, the transparent conductive oxidization film may be etched by the wet etching process to thus form a lower layer of the fourth conductive layer.

In an exemplary embodiment, the transparent conductive oxidization film may include at least one of ITO, IZO, IGZO, and ITZO, and the lower layer may include at least one of ITO, IZO, IGZO, and ITZO.

In an exemplary embodiment, the method may further include, between the providing a substrate and the forming the inorganic insulating layer on the substrate: forming a semiconductor layer on the substrate, forming a first insulating layer on the semiconductor layer, forming a first conductive layer on the first insulating layer, and forming a second insulating layer on the first conductive layer, where the inorganic insulating layer is disposed on the second insulating layer.

According to the exemplary embodiments, the exposed portion of the organic layer may be prevented from reacting with the etching gas and generating the particles, and the yield may be improved by forming a transparent conductive oxidization film between the organic layer and the metal layer and thereby adding the wet etching process.

Further, the second source drain conductive layer formed on the first organic layer is formed to be at least a triple-layered structure, and the transparent conductive oxidization film is included in the lower layer, thereby improving the yield.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
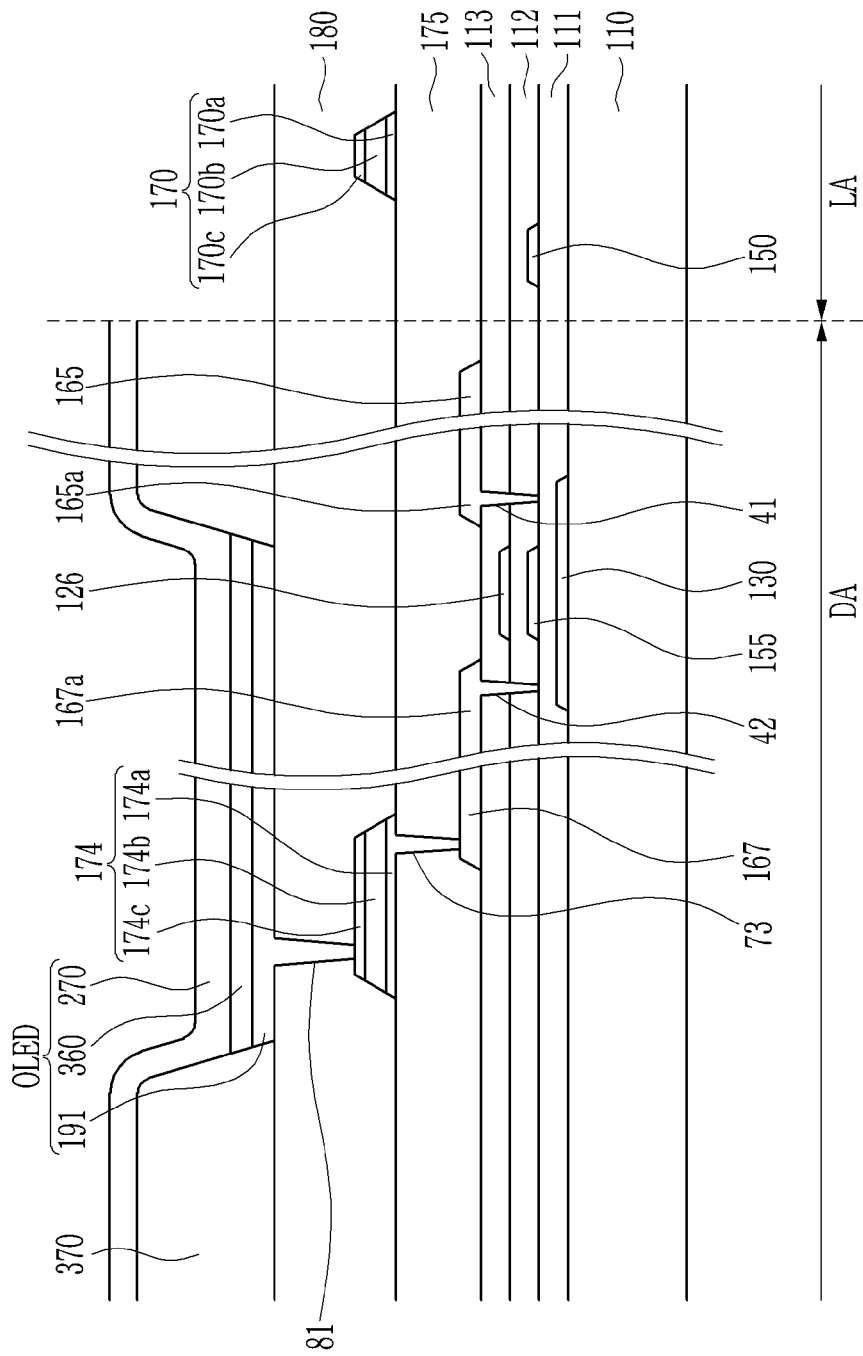
FIG. 1 shows a cross-sectional view of an exemplary embodiment of an organic light emitting diode display.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

The drawings and description are to be regarded as illustrative in nature and not restrictive, and like reference numerals designate like elements throughout the specification.

The size and thickness of each configuration shown in the drawings are arbitrarily shown for better understanding and ease of description, and the invention is not limited thereto. In the drawings, the thickness of layers, films, panels, regions, etc., are exaggerated for clarity. For better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the drawing figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless explicitly described to the contrary, the word "comprise" and variations such as "comprises" or "comprising" will be understood to imply the inclusion of stated elements but not the exclusion of any other elements.

The phrase "in a plan view" means viewing the object portion from the top, and the phrase "in a cross-section" means viewing a cross-section of which the object portion is vertically cut from the side.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

An organic light emitting diode display in an exemplary embodiment will now be described with reference to FIG. 1.

FIG. 1 shows a cross-sectional view of an exemplary embodiment of an organic light emitting diode display.

Referring to FIG. 1, the organic light emitting diode display in an exemplary embodiment includes a substrate 110, a semiconductor layer 130, a first gate insulating layer 111, first gate conductive layers 155 and 150, a second gate insulating layer 112, a second gate conductive layer 126, an interlayer insulating layer 113, first source drain conductive layers 165 and 167, a first organic layer 175, second source drain conductive layers 174 and 170, a second organic layer 180, an anode 191, an organic emission layer 360, a cathode 270, and a partition 370. Here, the first gate conductive layer will be referred to as a first conductive layer, the second gate conductive layer will be referred to as a second conductive layer, the first source drain conductive layer will be referred to as a third conductive layer, the second source drain conductive layer will be referred to as a fourth conductive layer, the first gate insulating layer will be referred to as a first insulating layer, the second gate insulating layer will be referred to as a second insulating layer, and the interlayer insulating layer will be referred to as a third insulating layer. The anode 191, the organic emission layer 360, and the cathode 270 configure an organic light emitting diode ("OLED").

The substrate 110 includes a display area DA in which a plurality of pixels are provided and images are displayed, and a line area LA in which lines for applying signals to pixels are provided. In an exemplary embodiment, the substrate 110 may include glass, plastic, or polyimide (PI), for example.

The semiconductor layer 130 is disposed on the substrate 110. The semiconductor layer 130 includes an oxide semiconductor, and it includes a channel region, a source region, and a drain region. Here, the semiconductor layer 130 formed in the display area DA corresponds to a first semiconductor.

The semiconductor layer 130 is covered by the first gate insulating layer 111. In an exemplary embodiment, the first gate insulating layer 111 includes an inorganic insulating layer, which may include silicon oxynitride (SiOx) or silicon nitride (SiNx), for example.

The first gate conductive layers 155 and 150 are disposed on the first gate insulating layer 111. The first gate conductive layers 155 and 150 include a driving gate electrode 155 and a gate signal line 150. The driving gate electrode 155 is formed on a position overlapping a channel region of the first semiconductor, and the gate signal line 150 is formed in the line area LA. In an exemplary embodiment, the driving gate electrode 155 includes a metal material, which may include at least one of aluminum (Al), molybdenum (Mo), and copper (Cu), for example.

The first gate conductive layers 155 and 150 are covered by the second gate insulating layer 112. In an exemplary embodiment, the second gate insulating layer 112 includes an inorganic insulating layer, which may include silicon oxynitride (SiOx) or a silicon nitride (SiNx), for example.

The second gate conductive layer 126 is disposed on the second gate insulating layer 112. The second gate conductive layer 126 includes a storage electrode 126. The storage electrode 126 is formed on a position overlapping the driving gate electrode 155, and it configures a storage capacitor together with a driving gate electrode 155.

The second gate conductive layer 126 is covered by an interlayer insulating layer 113. In an exemplary embodiment, the interlayer insulating layer 113 includes an inorganic insulating layer including a silicon oxynitride (SiOx) or a silicon nitride (SiNx), for example.

Openings 41 and 42 for exposing a source region and a drain region of the first semiconductor 130 are defined in the interlayer insulating layer 113. Further, the openings 41 and 42 for exposing a source region and a drain region are defined in the first gate insulating layer 111 and the second gate insulating layer 112.

The first source drain conductive layers 165 and 167 are disposed on the interlayer insulating layer 113. The first source drain conductive layers 165 and 167 include a data connector 165 and a repair connector 167. Here, the data connector 165 includes a first source electrode 165a, and a part of the repair connector 167 includes a first drain electrode 167a.

The first source electrode 165a is a part of the data connector 165, and it is physically connected to the source region of the first semiconductor through the opening 41. The first drain electrode 167a is a part of the repair connector 167, and it is physically connected to the drain region of the first semiconductor through the opening 42.

Although not shown in FIG. 1, the first source electrode 165a is electrically connected to a switching transistor T2 (refer to FIG. 11), to be described, through the data connector 165 to receive a data voltage from the switching transistor T2. Further, the first drain electrode 167a is electrically connected to an anode 191 of the organic light emitting diode OLED, and it transmits an output current from the anode 191.

The first semiconductor 130, the first source electrode 165a, the first drain electrode 167a, and the driving gate electrode 155 compose a thin film transistor.

In an exemplary embodiment, the first source drain conductive layers 165 and 167 include a metal material, which may include at least one of aluminum (Al), molybdenum (Mo), and copper (Cu), for example. In an exemplary embodiment, the first source drain conductive layers 165 and 167 may be provided to be a dual layer including titanium (Ti) and titanium nitride (TiN) on a lower layer and aluminum (Al), molybdenum (Mo), and copper (Cu) on an upper layer in exemplary embodiments.

The first organic layer 175 is disposed on the first source drain conductive layers 165 and 167. The first organic layer 175 includes polyimide (PI), and it may include various organic insulating materials in exemplary embodiments. An opening 73 for connecting the repair connector 167 and a pixel electrode connector 174 to be described may be defined in the first organic layer 175.

The second source drain conductive layers 170 and 174 are disposed on the first organic layer 175. The second source drain conductive layers 170 and 174 include a driving voltage signal line 170 and a pixel electrode connector 174. The second source drain conductive layers 170 and 174 include a triple-layered structure, and a lower layer 170a/174a includes a transparent conductive oxidization film such as an indium tin oxide ("ITO"), an indium zinc oxide ("IZO"), an indium gallium zinc oxide ("IGZO"), or an indium tin zinc oxide ("ITZO"), a middle layer 170b/174b includes aluminum (Al), and an upper layer 170c/174c includes titanium (Ti). In exemplary embodiments, the second source drain conductive layers 170 and 174 may be provided to be quadruple layers or quintuple layers. The second source drain conductive layers 170 and 174 in the illustrated exemplary embodiment are provided to be at least triple-layered structures, and the lower layer includes a transparent conductive oxidization film such as ITO, IZO, IGZO, or ITZO, thereby preventing the first organic layer from being contaminated by particles, and improving a yield. A detailed content will be described in a manufacturing method of FIGS. 2 to 6 and a multilayered electrode structure of FIGS. 8 to 10 to be described.

The second organic layer 180 is disposed on the second source drain conductive layers 170 and 174. The second organic layer 180 includes polyimide (PI), it may include various organic insulating materials in exemplary embodiments, and an opening 81 for exposing the pixel electrode connector 174 may be defined in the second organic layer 180.

The anode 191 is disposed on the second organic layer 180. The anode 191 is provided to be a multilayer including ITO, IZO, ITZO, and a metal layer. The anode 191 is connected to the pixel electrode connector 174 through the opening 81 of the second organic layer 180. The pixel electrode connector 174 is connected to a first drain electrode 167a of the thin film transistor through an opening 73, so an output current of the first drain electrode 167a is transmitted to the anode 191 that is one electrode of the organic light emitting diode OLED to thus allow the organic light emitting diode OLED to emit light.

The organic emission layer 360 and the partition 370 are disposed on the anode 191. The partition 370 includes an organic material, and it may include polyimide (PI). The partition 370 partitions a position on which the organic emission layer 360 will be provided, and it may be disposed along an external side of the anode 191. Further, the partition 370 is shown to be disposed in the display area DA in FIG. 1, but it may be provided to expand up to the line area LA.

The organic emission layer 360 is disposed in the opening partitioned by the partition 370. The organic emission layer 360 is shown to be a single layer in FIG. 1, but in actuality, auxiliary layers such as an electron injection layer, an electron transport layer, a hole transport layer, or a hole injection layer are provided above/below the emission layer.

The cathode 270 is disposed on the partition 370 and the organic emission layer 360, and the cathode 270 is provided to be a transparent conductive layer.

The anode 191, the organic emission layer 360, and the cathode 270 are not disposed in the line area LA, but in the display area DA.

The above-noted thin film transistor may be a driving transistor, and the driving transistor refers to a transistor for controlling an emitting degree of the organic light emitting diode OLED by generating an output current.

A method for manufacturing an organic light emitting diode display in an exemplary embodiment of FIG. 1 will now be described with reference to FIGS. 2 to 6.

Figure 2:
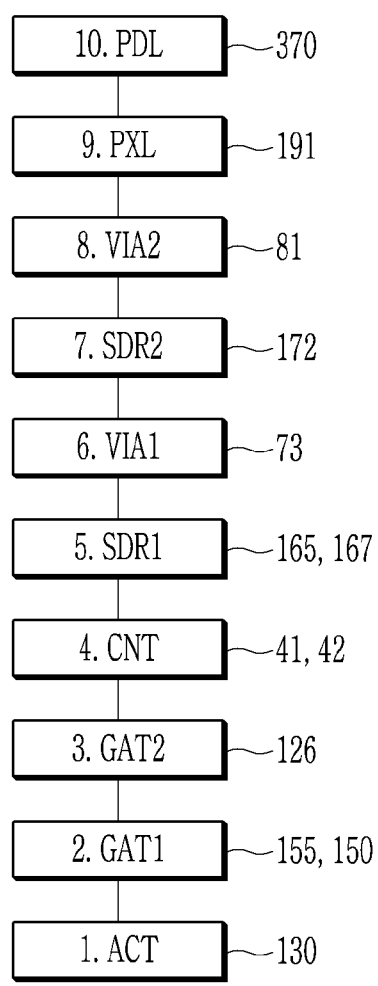
FIG. 2 shows an exemplary embodiment of a sequence for manufacturing an organic light emitting diode display.

FIG. 2 shows an exemplary embodiment of a sequence for manufacturing an organic light emitting diode display, and FIGS. 3 to 6 shows detailed cross-sectional views of an exemplary embodiment of a sequence for manufacturing a second source drain conductive layer in a process for manufacturing an organic light emitting diode display.

FIG. 2 shows a process for manufacturing a partition 370, and FIGS. 3 to 6 show a detailed stage for manufacturing a second source drain conductive layer on a first organic layer 175 in a process of FIG. 2.

FIG. 2 is shown with reference to a configuration in which a mask is used, and in the illustrated exemplary embodiment, the organic light emitting diode display is manufactured by ten sheets. The configuration provided for respective stages shown in FIG. 2 is indicated with the reference numerals of FIG. 1 side by side so as to check which layer is provided in the stage.

Before performing the first stage of FIG. 2, the organic light emitting diode display in an exemplary embodiment is provided with a substrate 110. In the illustrated exemplary embodiment, the substrate 110 is a flexible substrate 110 including plastic or polyimide (PI).

The first stage shows forming a semiconductor layer 130 on the substrate 110. The semiconductor layer 130 is provided with a specific pattern on the substrate 110 by a first mask. The semiconductor layer 130 is provided with an oxide semiconductor.

After the first stage, a first gate insulating layer 111 is disposed on the semiconductor layer 130 so as to cover the semiconductor layer 130.

The second stage shows forming first gate conductive layers 155 and 150 on the first gate insulating layer 111. The first gate conductive layers 155 and 150 are provided by stacking materials forming first gate conductive layers 155 and 150 on the first gate insulating layer 111 and patterning the same by use of a second mask. In this instance, a photoresist is stacked on the material forming the first gate conductive layers 155 and 150, the same is exposed with a second mask to form a photoresist pattern, and the material forming the first gate conductive layers 155 and 150 is patterned according to the photoresist pattern to thus complete the first gate conductive layers 155 and 150. Below, the respective layers may be provided according to the above-noted scheme unless additional descriptions are provided. The first gate conductive layers 155 and 150 may use titanium (Ti), molybdenum (Mo), and copper (Cu), they may be provided to be a single-layered structure by a single metal material, and they may be provided to be a dual-layered structure by two metal materials. An exemplary embodiment of the dual-layered structure may be a one in which titanium (Ti) is disposed on a lower layer and molybdenum (Mo) is disposed on an upper layer.

After the second stage, a second gate insulating layer 112 is disposed on the first gate conductive layers 155 and 150 so as to cover the first gate conductive layers 155 and 150 and the first gate insulating layer 111.

A third stage is a stage for forming a second gate conductive layer 126 on the second gate insulating layer 112. The second gate conductive layer 126 is provided by stacking a material for forming a second gate conductive layer 126 on the second gate insulating layer 112 and patterning the second gate conductive layer 126 by a third mask. Here, the metal material used to the second gate conductive layer 126 may be titanium (Ti), molybdenum (Mo), and copper (Cu), it may be provided to be a single-layered structure by a single metal material, and it may be provided to be a dual-layered structure by two metal materials. As an exemplary embodiment of the dual-layered structure, titanium (Ti) may be disposed on the lower layer and molybdenum (Mo) may be disposed on the upper layer.

After the third stage, an interlayer insulating layer 113 is disposed on the second gate conductive layer 126 so as to cover the second gate conductive layer 126 and the second gate insulating layer 112.

A fourth stage represents defining openings 41 and 42 in the interlayer insulating layer 113. The openings 41 and 42 are defined in a region for exposing the source region and the drain region of the semiconductor layer 130 by a fourth mask on the interlayer insulating layer 113 stacked without a pattern. In this instance, the openings 41 and 42 may be defined in the first gate insulating layer 111 and the second gate insulating layer 112 by a dry etching process.

A fifth stage indicates forming first source drain conductive layers 165 and 167 on the interlayer insulating layer 113. The first source drain conductive layers 165 and 167 are provided by stacking materials for forming the first source drain conductive layers 165 and 167 on the interlayer insulating layer 113 and patterning the same by a fifth mask. In this instance, the first source drain conductive layers 165 and 167 are electrically connected to the source region and the drain region of the semiconductor layer 130 respectively exposed through the openings 41 and 42. The material of the first source drain conductive layers 165 and 167 may be provided to be a dual-layered structure including a lower layer including titanium (Ti) and an upper layer including aluminum (Al).

After the fifth stage, the first organic layer 175 is disposed on the first source drain conductive layers 165 and 167 so as to cover the first source drain conductive layers 165 and 167 and the interlayer insulating layer 113. The first organic layer 175 includes an organic material such as polyimide (PI).

A sixth stage represents defining an opening 73 in the first organic layer 175 stacked without a pattern by a sixth mask. Accordingly, the first drain electrode 167a of the thin film transistor is exposed.

A seventh stage represents forming second source drain conductive layers 170 and 174 on the first organic layer 175. The second source drain conductive layers 170 and 174 are provided by stacking materials for forming second source drain conductive layers 170 and 174 on the first organic layer 175 and patterning the same by a seventh mask. The materials for forming the second source drain conductive layers 170 and 174 are a transparent conductive oxidization film and a metal material, the transparent conductive oxidization film is stacked on the first organic layer 175, and the metal material is stacked on the transparent conductive oxidization film. Here, the transparent conductive oxidization film includes ITO, IZO, IGZO, and ITZO, and the metal material includes aluminum (Al), titanium (Ti), and titanium nitride (TiN). Accordingly, the second source drain conductive layers 170 and 174 provided to be multilayered in the illustrated exemplary embodiment are provided to include a transparent conductive oxidization film (e.g., ITO, IZO, IGZO, and ITZO) on lower layers 170a and 174a, and are provided to include a metal material on middle layers 170b and 174b and upper layers 170c and 174c. A process for forming multilayered second source drain conductive layers 170 and 174 is described in detail in FIGS. 3 to 6.

After the seventh stage, a second organic layer 180 is disposed on the second source drain conductive layers 170 and 174 so as to cover the second source drain conductive layers 170 and 174 and the first organic layer 175. The second organic layer 180 may include an organic material such as polyimide (PI).

An eighth stage represents defining an opening 81 in the second organic layer 180 stacked without a pattern by an eighth mask. The opening 81 may be provided in the second organic layer 180 so that the pixel electrode connector 174 may be exposed.

A ninth stage represents forming an anode 191 on the second organic layer 180. The anode 191 is provided to be patterned on the second organic layer 180 by a ninth mask. The anode 191 may be provided to be a multilayer including ITO, IZO, and a metal layer.

A tenth stage represents forming a partition 370 on the anode 191 by a tenth mask. The partition 370 may include an organic material.

A stage for forming an organic emission layer 360 on the anode 191 exposed by the partition 370, and a stage for forming a cathode 270 for covering the partition 370 and the organic emission layer 360, may be further included.

Hereinafter, a stage for forming the second source drain conductive layer described in the seventh stage of FIG. 2 will be described with reference to FIGS. 3 to 6.

The organic light emitting diode display in an exemplary embodiment with reference to FIGS. 3 to 6 shows that a plurality of metal layers, a plurality of inorganic insulating layers 200, and a first organic layer 175 are disposed on a substrate 110.

FIGS. 3 to 6 are provided to describe a stage for forming a second source drain conductive layer on a first organic layer 175, the semiconductor layer 130 (refer to FIG. 1), the first gate conductive layers 155 and 150 (refer to FIG. 1), the second gate conductive layer 126 (refer to FIG. 1), the first source drain conductive layers 167 and 165 (refer to FIG. 1), and the first, second, and third gate insulating layers 111, 112, and 113 provided in the first stage to the fifth stage described with reference to FIG. 2 are not described in detail, but are included in a plurality of inorganic insulating layers 200 on the substrate 110.

Figure 3:
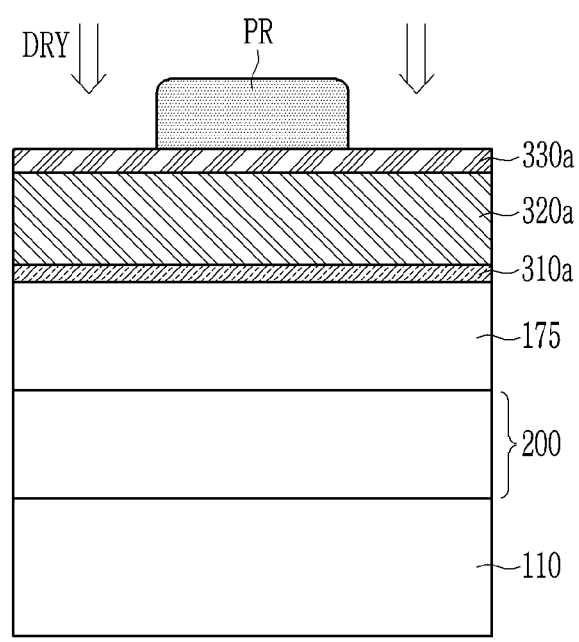
FIGS. 3 to 6 shows detailed cross-sectional views of an exemplary embodiment of a sequence for manufacturing a second source drain conductive layer in a process for manufacturing an organic light emitting diode display.

Referring to FIG. 3, a first organic layer 175 is disposed on a plurality of inorganic insulating layers 200. A transparent conductive oxidization film 310a, a metal layer 320a including aluminum (Al), and a metal layer 330a including titanium (Ti) are sequentially stacked on the first organic layer 175, and a photoresist PR is disposed on the metal layer 330a including titanium (Ti). In this instance, the photoresist PR is exposed by the seventh mask described with reference to FIG. 2, and the pattern is provided in advance.

Figure 4:
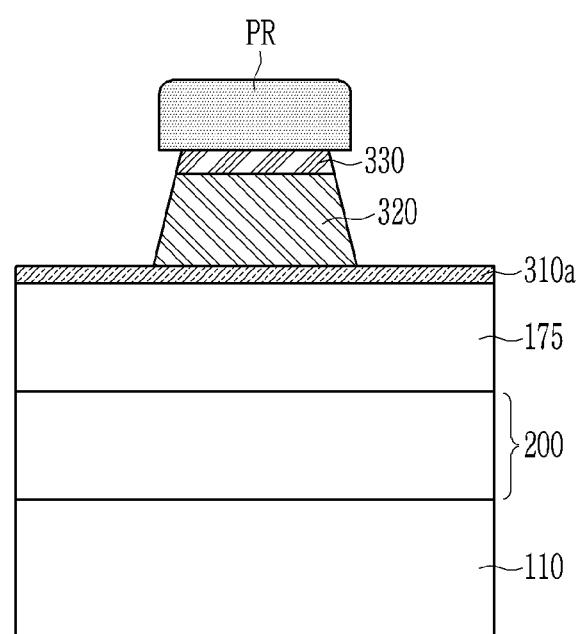

A dry etching process is performed according to a pattern of the photoresist PR. In an exemplary embodiment, the dry etching process may be performed in a vacuum chamber, and an etching gas such as chlorine (Cl$_2$), oxygen (O$_2$), nitrogen (N$_2$), sulfur hexafluoride (SF$_6$), nitrogen trifluoride (NF$_3$), or argon (Ar) may be used. In the illustrated exemplary embodiment, the metal layer 320a including aluminum (Al) and the metal layer 330a including titanium (Ti) react with the etching gas and are then removed except for a portion that is provided on a lower portion of the photoresist PR according to the dry etching process. Referring to FIG. 4, an upper layer 330 including titanium (Ti) and a middle layer 320 including aluminum (Al) are patterned on the transparent conductive oxidization film 310a.

Figure 5:
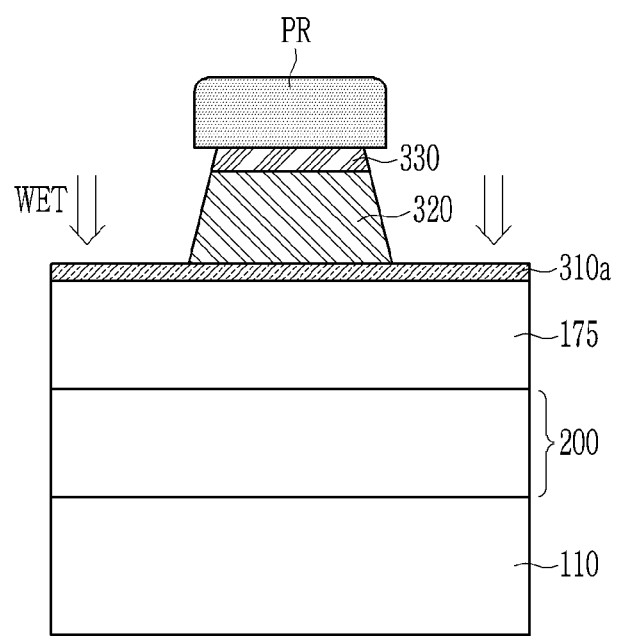

Referring to FIG. 5, after the dry etching process, the transparent conductive oxidization film 310a is patterned by a wet etching process. The transparent conductive oxidization film 310a has a zinc oxide as a main component, so it is easy to etch the same and no remaining film is generated. Further, the wet etching process does not use an etching gas, thereby preventing generation of particles caused by the reaction of the exposed portion of the first organic layer with the etching gas. Accordingly, the organic light emitting diode display in the illustrated exemplary embodiment may improve a yield by preventing generation of particles on the first organic layer in a process for forming a second source drain conductive layer. The transparent conductive oxidization film 310a is removed except for portions provided on lower sides of the upper layer 330 including titanium (Ti) and the middle layer 320 including aluminum (Al) according to a wet etching process.

Figure 6:
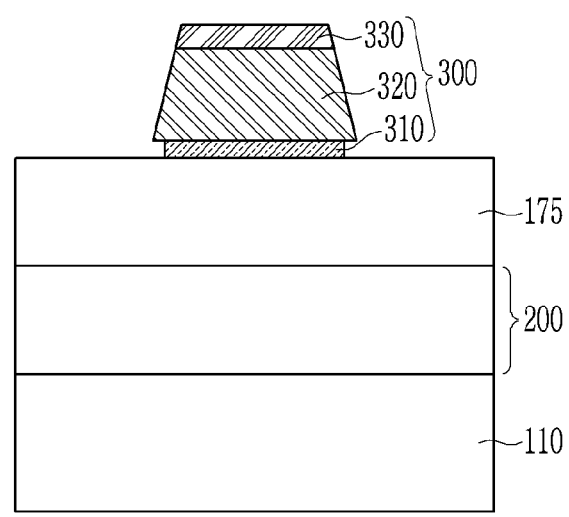

FIG. 6 shows that the photoresist PR is removed, and a second source drain conductive layer 300 is patterned over the first organic layer 175.

Referring to FIG. 6, the second source drain conductive layer 300 is provided to include a transparent conductive oxidization film on the lower layer 310, aluminum on the middle layer 320, and titanium on the upper layer 330.

On the contrary, the second source drain conductive layer according to a comparative example does not include a transparent conductive oxidization film. Accordingly, the lower layer includes aluminum and the upper layer includes titanium, so they may be provided by a dry etching process. However, when aluminum is stacked over the first organic layer and a dry etching process is performed, particles are generated on the first organic layer by the reaction of etching gas and the exposed portion of the first organic layer, so the yield is deteriorated.

The organic light emitting diode display in an exemplary embodiment has a transparent conductive oxidization film stacked on the first organic layer and a wet etching process is performed after a dry etching process, thereby preventing a reaction of etching gas and the first organic layer and preventing generation of particles from the first organic layer.

Figure 7:
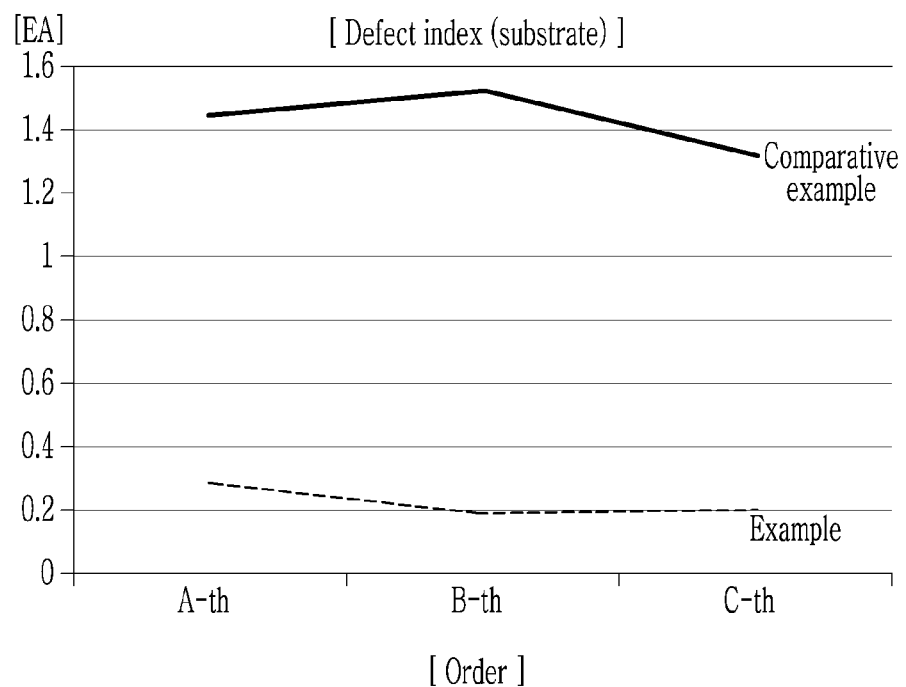
FIG. 7 shows a graph for indicating an effect caused by an exemplary embodiment of a method for manufacturing an organic light emitting diode display.

The above-noted effect may be confirmed by a graph shown in FIG. 7.

FIG. 7 shows a graph for indicating an effect caused by an exemplary embodiment of a method for manufacturing an organic light emitting diode display.

Referring to FIG. 7, regarding the organic light emitting diode display in an exemplary embodiment, it is found in the A-th, B-th, and C-th experiments that a defect index of the substrate is substantially reduced compared to the case according to the comparative example. The defect index of the substrate may increase when the particles are generated from the first organic layer after the first organic layer reacts with the etching gas in the dry etching process.

Accordingly, to reduce the defect index, the second source drain conductive layer in the illustrated exemplary embodiment includes a transparent conductive oxidization film on the lower layer, and it may be provided to be a triple layer, a quadruple layer, or a quintuple layer depending on the metal layer stacked on the lower layer.

A multilayered structure according to various exemplary embodiments of a second source drain conductive layer will now be described with reference to FIGS. 8 to 10.

Figure 8:
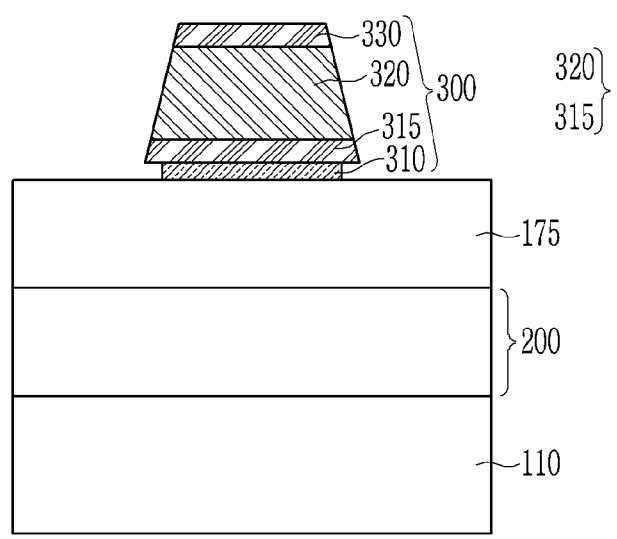
FIGS. 8 to 10 show an exemplary embodiment of a multilayered electrode of an organic light emitting diode display.
Figure 9:
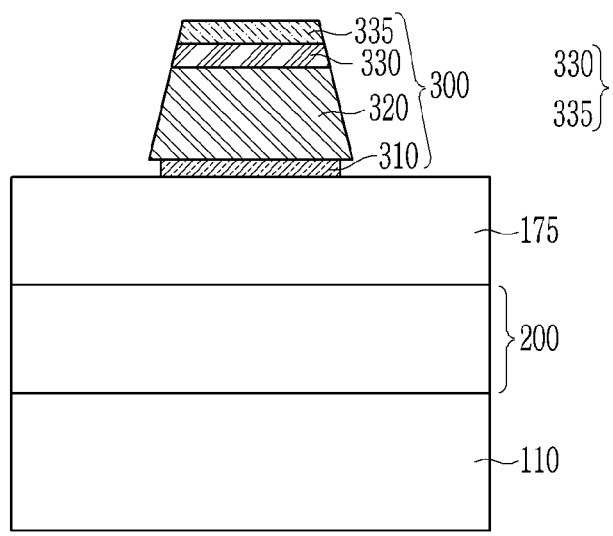
Figure 10:
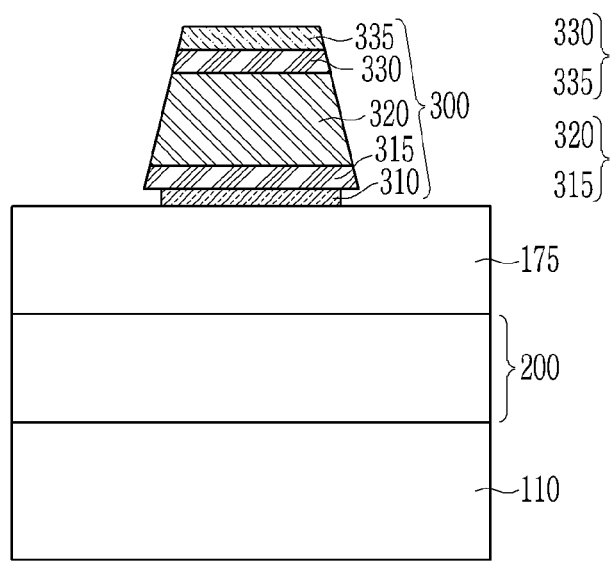

FIGS. 8 to 10 show an exemplary embodiment of a multilayered electrode of an organic light emitting diode display.

Referring to FIG. 8, a second source drain conductive layer 300 is disposed on the first organic layer 175. The second source drain conductive layer 300 is provided to include a lower layer 310, middle layers 315 and 320, and an upper layer 330. The lower layer 310 includes a transparent conductive oxidization film, the middle layers 315 and 320 include a metal layer 315 including titanium (Ti) and a metal layer 320 including aluminum (Al), and the upper layer 330 includes a metal layer 330 including titanium (Ti).

The second source drain conductive layer 300 of FIG. 9 is provided to include a lower layer 310 including a transparent conductive oxidization film, a middle layer 320 including a metal layer 320 including aluminum, and upper layers 330 and 335. Here, the upper layers 330 and 335 include a metal layer 330 including titanium and a metal layer 335 including titanium nitride.

The second source drain conductive layer 300 of FIG. 10 is provided to include a lower layer 310 including a transparent conductive oxidization film, middle layers 315 and 320, and upper layers 330 and 335, the middle layers 315 and 320 include a metal layer 315 including titanium (Ti) and a metal layer 320 including aluminum (Al), and the upper layers 330 and 335 include a metal layer 330 including titanium and a metal layer 335 including titanium nitride.

As described, the second source drain conductive layer in an exemplary embodiment may be provided in various ways to include a transparent conductive oxidization film on the lower layer, and to include a metal layer including aluminum, titanium, or titanium nitride on the middle layers and the upper layers.

A method for driving an organic light emitting diode display in an exemplary embodiment will now be described with reference to FIG. 11.

Figure 11:
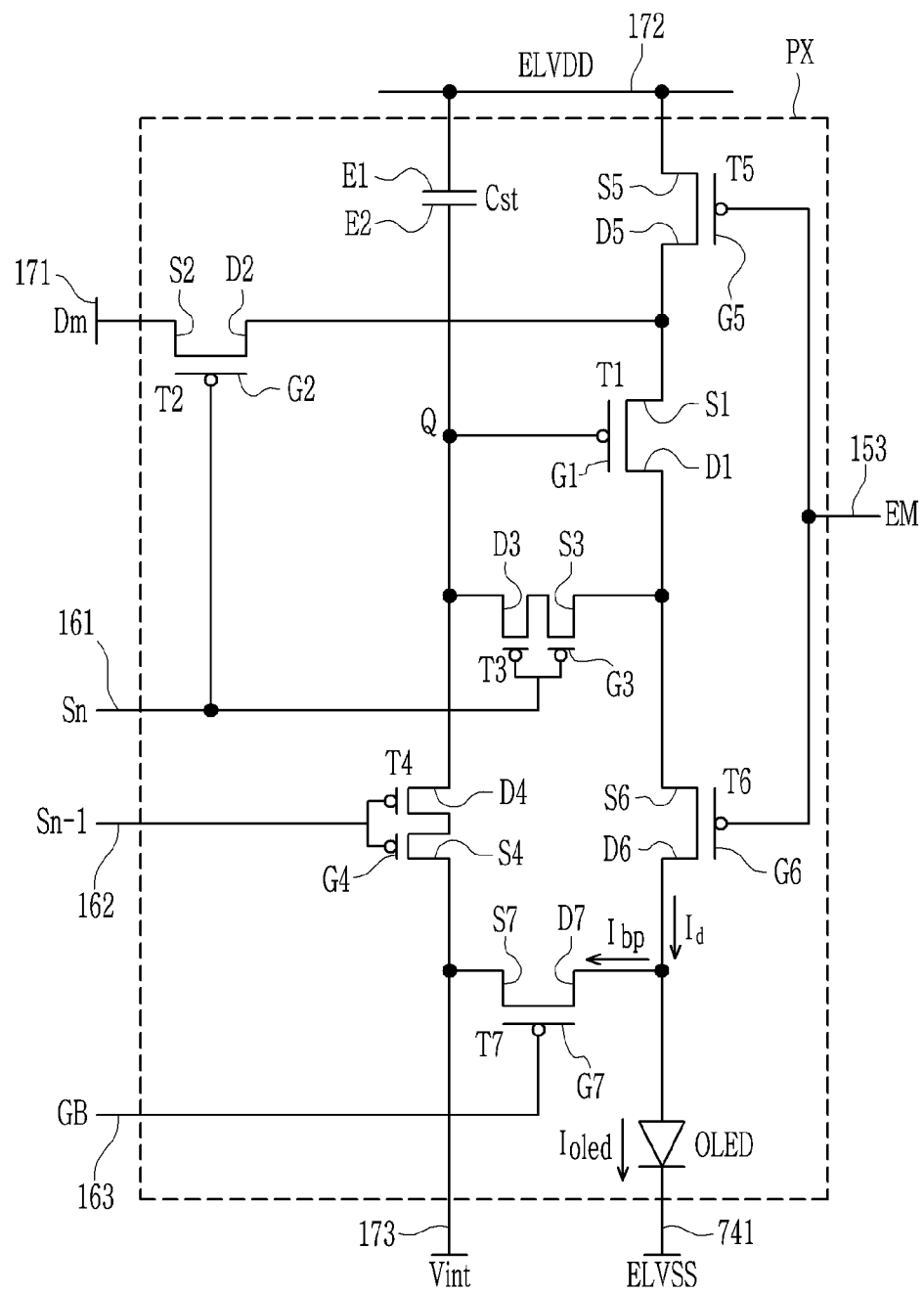
FIG. 11 shows a circuit diagram of an exemplary embodiment of one pixel of an organic light emitting diode display.

FIG. 11 shows a circuit diagram of one pixel of an organic light emitting diode display.

Referring to FIG. 11, a pixel PX of the organic light emitting diode display includes a plurality of transistors T1, T2, T3, T4, T5, T6, and T7 connected to signal lines 173, 161, 162, 153, 163, 171, 172, and 741, a storage capacitor Cst, and an organic light emitting diode OLED.

The organic light emitting diode display includes a display area for displaying images, and the pixel PX is arranged in the display area in various ways such as a matrix.

A plurality of transistors T1, T2, T3, T4, T5, T6, and T7 includes a driving transistor T1 and include switching transistors connected to the scan line 161, that is, a second transistor T2 and a third transistor T3, and the other transistors represent transistors (referred to as compensation transistors hereinafter) for operating the organic light emitting diode OLED. The compensation transistors T4, T5, T6, and T7 may include a fourth transistor T4, a fifth transistor T5, a sixth transistor T6, and a seventh transistor T7. The plurality of signal lines 173, 161, 162, 153, 163, 171, 172, and 741 may include a scan line 161, a previous-stage scan line 162, an emission control signal line 153, a bypass control line 163, a data line 171, a driving voltage line 172, an initialization voltage line 173, and a common voltage line 741.

The scan line 161 is connected to a gate driver (not shown) to transmit a scan signal Sn to the second transistor T2 and the third transistor T3, where n is a natural number greater than one. The previous-stage scan line 162 is connected to a gate driver to transmit a previous-stage scan signal Sn-1 applied to the pixel PX provided on the previous stage to the fourth transistor T4. The emission control signal line 153 is connected to an emission controller (not shown), and it transmits an emission control signal EM for controlling a time for the organic light emitting diode OLED to emit light to the fifth transistor T5 and the sixth transistor T6. The bypass control line 163 transmits a bypass signal GB to the seventh transistor T7.

The data line 171 is a wire for transmitting a data voltage Dm generated by a data driver (not shown), where m is a natural number, and luminance of light emitted by the organic light emitting diode OLED changes according to the data voltage Dm. The driving voltage line 172 applies a driving voltage ELVDD, the initialization voltage line 173 transmits an initialization voltage Vint for initializing the driving transistor T1, and the common voltage line 741 applies a common voltage ELVSS. Constant voltages may be applied to the driving voltage line 172, the initialization voltage line 173, and the common voltage line 741.

The driving transistor T1 controls a size of the current output by the data voltage Dm, and the output driving current Id is applied to the organic light emitting diode OLED to control brightness of the organic light emitting diode OLED according to the data voltage Dm. For this purpose, a first electrode S1 of the driving transistor T1 is disposed to receive the driving voltage ELVDD, and is connected to the driving voltage line 172 through the fifth transistor T5. Further, the first electrode S1 of the driving transistor T1 is connected to a second electrode D2 of the second transistor T2 to receive the data voltage Dm. The second electrode D1 (an electrode on the output side) is disposed to output a current toward the organic light emitting diode OLED, and it passes through the sixth transistor T6 and is connected to the anode of the organic light emitting diode OLED. In addition, the gate electrode G1 is connected to one electrode (a second storage electrode E2) of the storage capacitor Cst. Therefore, a voltage at a gate electrode G1 changes according to a voltage stored in the storage capacitor Cst and the driving current Id output by the driving transistor T1 changes.

The second transistor T2 allows the data voltage Dm to be received into the pixel PX. The gate electrode G2 is connected to the scan line 161, and the first electrode S2 is connected to the data line 171. A second electrode D2 of the second transistor T2 is connected to a first electrode S1 of the driving transistor T1. When the second transistor T2 is turned on by the scan signal Sn transmitted through the scan line 161, the data voltage Dm transmitted through the data line 171 is transmitted to the first electrode S1 of the driving transistor T1.

The third transistor T3 transmits the compensation voltage (the voltage of Dm+Vth) that is changed when the data voltage Dm passes through the driving transistor T1 to the second storage electrode E2 of the storage capacitor Cst. The gate electrode G3 is connected to the scan line 161, and the first electrode S3 is connected to the second electrode D1 of the driving transistor T1. A second electrode D3 of the third transistor T3 is connected to a second storage electrode E2 of the storage capacitor Cst and a gate electrode G1 of the driving transistor T1.

The third transistor T3 is turned on according to the scan signal Sn transmitted through the scan line 161 to connect the gate electrode G1 of the driving transistor T1 and the second electrode D1, and to also connect the second electrode D1 of the driving transistor T1 and the second storage electrode E2 of the storage capacitor Cst.

The fourth transistor T4 initializes the gate electrode G1 of the driving transistor T1 and the second storage electrode E2 of the storage capacitor Cst. The gate electrode G4 is connected to the previous-stage scan line 162, and the first electrode S4 is connected to the initialization voltage line 173. A second electrode D4 of the fourth transistor T4 is connected to the second storage electrode E2 of the storage capacitor Cst and the gate electrode G1 of the driving transistor T1 through the second electrode D3 of the third transistor T3. The fourth transistor T4 transmits an initialization voltage Vint to the gate electrode G1 of the driving transistor T1 and the second storage electrode E2 of the storage capacitor Cst according to the previous-stage scan signal Sn-1 transmitted through the previous-stage scan line 162. Accordingly, a gate voltage at the gate electrode G1 of the driving transistor T1 and the storage capacitor Cst are initialized. The initialization voltage Vint may have a low voltage for turning on the driving transistor T1.

The fifth transistor T5 transmits a driving voltage ELVDD to the driving transistor T1. The gate electrode G5 is connected to the emission control signal line 153, and the first electrode S5 is connected to the driving voltage line 172. The second electrode D5 of the fifth transistor T5 is connected to the first electrode S1 of the driving transistor T1.

The sixth transistor T6 transmits the driving current Id output by the driving transistor T1 to the organic light emitting diode OLED. The gate electrode G6 is connected to the emission control signal line 153, and the first electrode S6 is connected to the second electrode D1 of the driving transistor T1. The second electrode D6 of the sixth transistor T6 is connected to the anode of the organic light emitting diode OLED.

The fifth transistor T5 and the sixth transistor T6 are turned on according to the emission control signal EM transmitted through the emission control signal line 153, and when the driving voltage ELVDD is applied to the first electrode S1 of the driving transistor T1 through the fifth transistor T5, the driving transistor T1 outputs the driving current Id according to a voltage (i.e., a voltage at the second storage electrode E2 of the storage capacitor Cst) at the gate electrode G1 of the driving transistor T1. The output driving current Id is transmitted to the organic light emitting diode OLED through the sixth transistor T6. As a current bled flows to the organic light emitting diode OLED, the organic light emitting diode OLED emits light.

The seventh transistor T7 initializes the anode of the organic light emitting diode OLED. The gate electrode G7 is connected to the bypass control line 163, the first electrode S7 is connected to the anode of the organic light emitting diode OLED, and the second electrode D7 is connected to the initialization voltage line 173. In an exemplary embodiment, the bypass control line 163 may be connected to the previous-stage scan line 162, and the bypass signal GB is applied as a signal with a same timing as the previous-stage scan signal Sn-1. In another exemplary embodiment, the bypass control line 163 may not be connected to the previous-stage scan line 162, and may transmit a signal that is different from the previous-stage scan signal Sn-1. When the seventh transistor T7 is turned on by the bypass signal GB, the initialization voltage Vint is applied to the anode of the organic light emitting diode OLED and is then initialized.

The first storage electrode E1 of the storage capacitor Cst is connected to the driving voltage line 172, and the second storage electrode E2 is connected to the gate electrode G1 of the driving transistor T1, the second electrode D3 of the third transistor T3, and the second electrode D4 of the fourth transistor T4. As a result, the second storage electrode E2 determines the voltage at the gate electrode G1 of the driving transistor T1, and it receives the data voltage Dm through the second electrode D3 of the third transistor T3 or receives the initialization voltage Vint through the second electrode D4 of the fourth transistor T4.

The anode of the organic light emitting diode OLED is connected to the second electrode D6 of the sixth transistor T6 and the first electrode S7 of the seventh transistor T7, and the cathode is connected to a common voltage line 741 for transmitting a common voltage ELVSS.

In an exemplary embodiment described with reference to FIG. 11, a pixel circuit includes seven transistors T1 to T7 and one capacitor Cst, but it is not limited thereto, and a number of transistors and a number of capacitors, and connections therebetween, are modifiable in various ways.

An operation of one pixel of an organic light emitting diode display in an exemplary embodiment will now be described with reference to FIG. 11.

During an initialization section, a low-level previous-stage scan signal Sn-1 is supplied to the pixel PX through the previous-stage scan line 162. The fourth transistor T4 having received it is then turned on, and the initialization voltage Vint is applied to the gate electrode G1 of the driving transistor T1 and the second storage electrode E2 of the storage capacitor Cst through the fourth transistor T4. As a result, the driving transistor T1 and the storage capacitor Cst are initialized. The initialization voltage Vint may have a low voltage and the driving transistor T1 may be turned on.

During an initialization section, a low-level bypass signal GB is applied to the seventh transistor T7. The seventh transistor T7 having received it is turned on, and the initialization voltage Vint is applied to the anode of the organic light emitting diode OLED through the seventh transistor T7. As a result, the anode of the organic light emitting diode OLED is initialized.

During a data programming section, a low-level scan signal Sn is supplied to the pixel PX through the scan line 161. The second transistor T2 and the third transistor T3 are turned on by the low-level scan signal Sn.

When the second transistor T2 is turned on, the data voltage Dm is input to the first electrode S1 of the driving transistor T1 through the second transistor T2.

Further, for the data programming section, the third transistor T3 is turned on, and as a result, the second electrode D3 of the third transistor T3 is electrically connected to the gate electrode G1 and the second storage electrode E2 of the storage capacitor Cst. The gate electrode G1 of the driving transistor T1 and the second electrode D1 are connected to each other to configure a diode-connection. Further, for the initialization section, a low voltage (an initialization voltage Vint) is applied to the gate electrode G1 and the driving transistor T1 is turned on. As a result, the data voltage Dm input to the first electrode S1 of the driving transistor T1 passes through the channel of the driving transistor T1, it is output from the second electrode D1, it passes through the third transistor T3, and it is stored in the second storage electrode E2 of the storage capacitor Cst.

For an emission section, the emission control signal EM supplied from the emission control signal line 153 has a low level value, and the fifth transistor T5 and the sixth transistor T6 are turned on. As a result, a driving voltage ELVDD is applied to the first electrode S1 of the driving transistor T1, and the second electrode D1 of the driving transistor T1 is connected to the organic light emitting diode OLED.

When the emission section is finished, the initialization section is provided again, and the same operation is repeated from the start.

One of a first electrode and a second electrode of each of a plurality of transistors T1, T2, T3, T4, T5, T6, and T7 may become a source electrode and the other thereof may become a drain electrode according to a direction in which a voltage or a current is applied.

An organic light emitting diode display including a multilayered second source drain conductive layer in an exemplary embodiment will now be described with reference to FIGS. 12 to 14.

Figure 12:
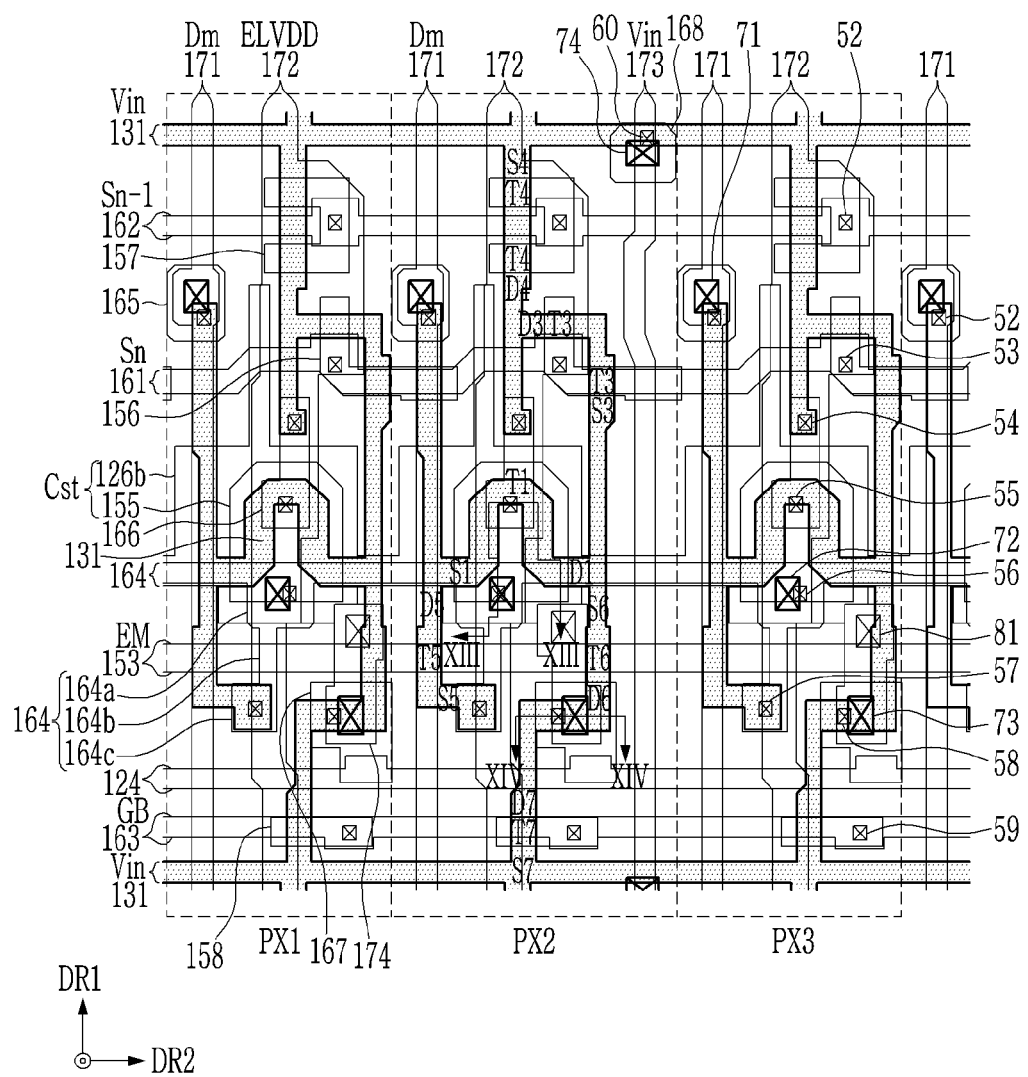
FIG. 12 shows a plan view of an exemplary embodiment of a pixel of an organic light emitting diode display.
Figure 13:
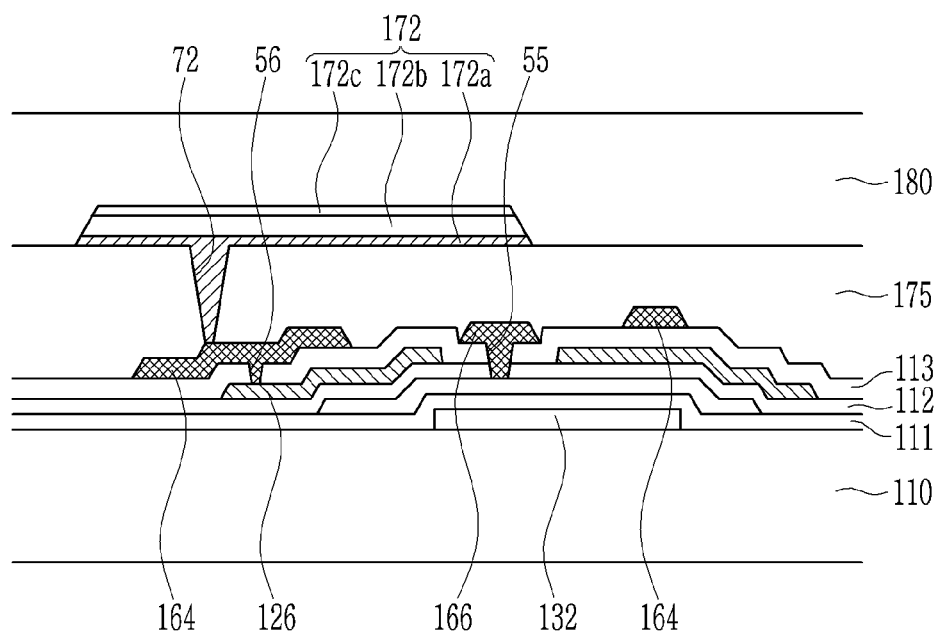
FIG. 13 shows a cross-sectional view along line XIII-XIII' of FIG. 12.
Figure 14:
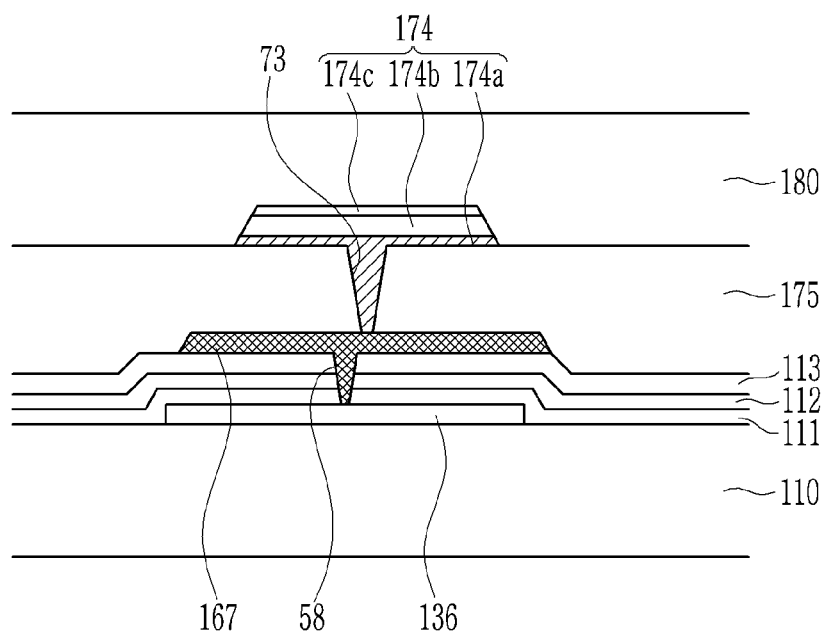
FIG. 14 shows a cross-sectional view along line XIV-XIV' of FIG. 12.

FIG. 12 shows a plan view of an exemplary embodiment of a pixel of an organic light emitting diode display, FIG. 13 shows a cross-sectional view along line XIII-XIII' of FIG. 12, and FIG. 14 shows a cross-sectional view along line XIV-XIV' of FIG. 12.

A disposal structure of an organic light emitting diode display in an exemplary embodiment in a plan view will now be described with reference to FIG. 12. FIG. 12 shows three subpixels PX1, PX2, and PX3 configuring one pixel PX, and the subpixels PX1, PX2, and PX3 include a same configuration, so the entire structure forming one pixel PX in a plan view will be mainly described.

The organic light emitting diode display includes a previous-stage scan line 162 extending in a second direction DR2 and transmitting a previous-stage scan signal Sn-1, a scan line 161 for transmitting a scan signal Sn, a horizontal driving voltage line 164 for transmitting a driving voltage ELVDD in the second direction DR2, an emission control signal line 153 for transmitting an emission control signal EM, a bypass control line 163 for transmitting a bypass signal GB, a horizontal initialization voltage line 131 for transmitting an initialization voltage Vint in the second direction DR2, and a repair line 124.

The previous-stage scan line 162 is provided to include a portion of which a thickness expands from among a portion extending in the second direction DR2. The expanding portion of the previous-stage scan line 162 overlaps a gate electrode 157 of the fourth transistor T4, and the overlapping portion is connected to the fourth gate electrode 157 through an opening 52.

The scan line 161 is provided to include a curved portion. A portion that is curved upward in an inclined way in a plan view overlaps the gate electrode 156 of the third transistor T3, and it is connected to the third gate electrode 156 through an opening 53.

The horizontal driving voltage line 164 includes an expansion 164a of which a thickness expands from among a portion extending in the second direction DR2, an extension 164b extending in the first direction DR1 from the expansion 164a, and a terminal 164c connected to the extension 164b. The expansion 164a of the horizontal driving voltage line 164 overlaps the driving voltage line 172, and it is connected to the driving voltage line 172 through an opening 72. Further, the expansion 164a of the horizontal driving voltage line 164 partly overlaps the driving gate electrode 155, and it is connected to the driving gate electrode 155 through an opening 56 to transmit a driving voltage ELVDD to the driving gate electrode 155. The terminal 164c of the horizontal driving voltage line 164 overlaps the second electrode of the fifth transistor T5 and is connected through an opening 57.

The emission control signal line 153 is provided to have a constant thickness, and it is disposed in a different layer from the previous-stage scan line 162, the scan line 161, and the horizontal driving voltage line 164 in a cross-sectional view. The emission control signal line 153 is disposed in the same layer as the driving gate electrode 155 as described with reference to FIG. 1.

The bypass control line 163 is provided to include a portion of which a thickness expands from among a portion extending in the second direction DR2. The expanding portion of the bypass control line 163 overlaps a gate electrode 158 of the seventh transistor T7, and the overlapping portion is connected to the seventh gate electrode 158 through an opening 59.

The horizontal initialization voltage line 131 is provided to have a constant thickness, and it is connected to the semiconductor layer 130 (refer to FIG. 1) of the fourth transistor T4 and the semiconductor layer 130 of the seventh transistor T7.

The repair line 124 is provided to include a portion of which a thickness expands from among a portion extending in the second direction DR2. The expanding portion of the repair line 124 overlaps part of the repair connector 167. In an exemplary embodiment, the overlapping portion of the repair line 124 may be electrically connected to the repair connector 167 through a laser process, for example. Accordingly, the repair connector 167 is connected to the pixel electrode connector 174, and the pixel electrode connector 174 is connected to the anode, to thus transmit the driving voltage ELVDD to the organic light emitting diode OLED.

The organic light emitting diode display includes a data line 171 extending in the first direction DR1 crossing the second direction DR2 and transmitting a data voltage Dm, a driving voltage line 172 for transmitting a driving voltage ELVDD, and an initialization voltage line 173 for transmitting an initialization voltage Vint.

The data line 171 is provided to include a portion of which a thickness expands from among a portion extending in the first direction DR1, and the portion of which a thickness expands to overlap the data connector 165. The data line 171 is connected to the data connector 165 through an opening 71.

The driving voltage line 172 is provided to include an expanding portion of which a thickness is different from among a portion extending in the first direction DR1. The expanding portion of the driving voltage line 172 is provided to partly overlap the fourth transistor T4 and the third transistor T3 in a plan view. The driving voltage line 172 overlaps the expansion 164a of the horizontal driving voltage line 164, and the expansion 164a of the horizontal driving voltage line 164 is connected to the driving voltage line 172 through the opening 72, thereby receiving the driving voltage ELVDD.

The initialization voltage line 173 is provided lengthily between the second pixel PX2 and the third pixel PX3. Part of the initialization voltage line 173 is provided to overlap an initialization connector 168, and it is connected to the initialization connector 168 through an opening 74. The initialization connector 168 overlaps part of the horizontal initialization voltage line 131, and it is connected through an opening 60. Accordingly, the initialization voltage Vint applied from the initialization voltage line 173 is transmitted to the horizontal initialization voltage line 131 through the initialization connector 168.

The organic light emitting diode display includes a driving transistor (T1, a first transistor), a second transistor T2, a third transistor T3, a fourth transistor T4, a fifth transistor T5, a sixth transistor T6, a seventh transistor T7, a storage capacitor Cst, and an organic light emitting diode OLED.

Respective channels of the driving transistor T1, the second transistor T2, the third transistor T3, the fourth transistor T4, the fifth transistor T5, the sixth transistor T6, and the seventh transistor T7 are provided in the semiconductor layer 130 extending lengthily. In addition, at least part of the first electrode and the second electrode of the plurality of transistors T1, T2, T3, T4, T5, T6, and T7 is provided on the semiconductor layer 130. The semiconductor layer 130 may be provided to be curved in various shapes. The semiconductor layer 130 may include an oxide semiconductor.

The semiconductor layer 130 includes a channel doped with an n-type impurity or a p-type impurity, and a first doping region and a second doping region provided on respective sides of the channel and having a greater doping concentration than the impurity doped to the channel. The first doping region and the second doping region correspond to the first electrode and the second electrode of the plurality of transistors T1, T2, T3, T4, T5, T6, and T7. When one of the first doping region and the second doping region is a source region, the other may be a drain region. Further, a region between the first electrode and the second electrode of different transistors is doped on the semiconductor layer 130, so two transistors may be electrically connected to each other.

The respective channels of the plurality of transistors T1, T2, T3, T4, T5, T6, and T7 overlap gate electrodes of the transistors T1, T2, T3, T4, T5, T6, and T7, and they are provided between the first electrodes and the second electrodes of the transistors T1, T2, T3, T4, T5, T6, and T7. The plurality of transistors T1, T2, T3, T4, T5, T6, and T7 may have a substantially identical stacked structure. The driving transistor T1 will be mainly described in detail below, and the other transistors T2, T3, T4, T5, T6, and T7 will be briefly described.

The driving transistor T1 includes a channel, a driving gate electrode 155 (a first gate electrode), a first electrode S1, and a second electrode D1. The channel of the driving transistor T1 is provided between the first electrode S1 and the second electrode D1, and it overlaps the driving gate electrode 155 in a plan view. The channel is curved so that the length of the channel may increase in a limited region. As the length of channel increases, a driving range of the gate voltage (Vg) applied to the driving gate electrode 155 of the driving transistor T1 widens, and the driving current Id constantly increases according to the gate voltage (Vg). As a result, grays of light emitted by the organic light emitting diode OLED may be more precisely controlled by changing the magnitude of the gate voltage (Vg), and display quality of the organic light emitting diode display may be improved. A shape of the channel is not limited to the above-noted ones, and it may have various shapes such as a U shape or an S shape.

The driving gate electrode 155 overlaps the channel in a plan view. The first electrode S1 and the second electrode D1 are provided on respective sides of the channel. An overlapping portion 126b of the storage electrode 126 (refer to FIG. 1) is provided over the driving gate electrode 155 in an insulated manner. The overlapping portion 126b of the storage electrode 126 overlaps the driving gate electrode 155 with a second gate insulating layer 112 therebetween in a plan view to thus configure a storage capacitor Cst. The overlapping portion 126b of the storage electrode 126 is a first storage electrode (E1 in FIG. 11) of the storage capacitor Cst, and the driving gate electrode 155 forms a second storage electrode (E2 in FIG. 11).

The gate electrode of the second transistor T2 may be part of the scan line 161. The first electrode S2 of the second transistor T2 is connected to the data line 171 through the data connector 165. The first electrode S2 is connected to the data connector 165 through the opening 52, and the data connector 165 is connected to the data line 171 through the opening 71. Accordingly, the first electrode S2 receives a data voltage Dm from the data line 171 through the data connector 165. The first electrode S2 and the second electrode D2 may be provided on the semiconductor layer 130.

The third transistor T3 may be configured with two transistors that are adjacent to each other. A mark of T3 is illustrated on a left side and a bottom side with respect to a portion where the semiconductor layer 130 is bent in one pixel PX1 of FIG. 12. The two portions respectively function as a third transistor T3, and a first electrode S3 of one third transistor T3 is connected to a second electrode D3 of the other third transistor T3. The two third transistors T3 share one gate electrode 156 (a third gate electrode). The third gate electrode 156 is provided to have an L shape, and it overlaps the channel in a predetermined region in a plan view. The third gate electrode 156 overlaps part of the scan line 161, and is connected to the scan line 161 through the opening 53. The above-described structure may be referred to as a dual gate structure, and it may function to block flow of a leakage current. The first electrode S3 of the third transistor T3 is connected to the first electrode S6 of the sixth transistor T6 and the second electrode D1 of the driving transistor T1. The second electrode D3 is connected to the driving gate electrode 155 of the driving transistor T1 through a gate connector 166. The gate connector 166 includes a first end connected to the second electrode D3 through an opening 54, and a second end connected to the driving gate electrode 155 of the driving transistor T1 through an opening 55.

The fourth transistor T4 is disposed on a portion where the fourth gate electrode 157 meets the semiconductor layer 130. In FIG. 12, a mark of T4 is illustrated on a top side and a bottom side with respect to a portion where the previous-stage scan line 162 meets the semiconductor layer 130 in one pixel PX1. The two portions respectively function as a fourth transistor T4, and the first electrode S4 of one fourth transistor T4 is connected to the second electrode D4 of the other fourth transistor T4. The above-described structure may be referred to as a dual gate structure, and it may function to block the leakage current. The two fourth transistors T4 share one gate electrode 157 (the fourth gate electrode). The fourth gate electrode 157 is provided to have a reverse ⊏ shape, and it overlaps the channel on top side and the bottom side with respect to the previous-stage scan line 162 in a plan view. The fourth gate electrode 157 overlaps part of the previous-stage scan line 162, and it is connected to the previous-stage scan line 162 through the opening 52. The second electrode D4 of the fourth transistor T4 is connected to the second electrode D3 of the third transistor T3 through the semiconductor layer 130.

The gate electrode of the fifth transistor T5 may be part of the emission control signal line 153. The first electrode S5 of the fifth transistor T5 is connected to the horizontal driving voltage line 164 through the opening 57, and the second electrode D5 is connected to the first electrode S1 of the driving transistor T1 through the semiconductor layer 130.

The gate electrode of the sixth transistor T6 may be part of the emission control signal line 153. The second electrode D6 of the sixth transistor T6 is connected to the repair connector 167 through an opening 58, and the first electrode S6 is connected to the second electrode of the driving transistor T1 through the semiconductor layer 130.

A gate electrode 158 (a seventh gate electrode) of the seventh transistor T7 overlaps part of the emission control signal line 153, and it is provided to be a long rectangle in the second direction DR2. The seventh gate electrode 158 is connected to the emission control signal line 153 through the opening 59. The first electrode S7 of the seventh transistor T7 may be connected to the first electrode S4 of the fourth transistor T4 disposed on the pixel PX provided in a bottom row direction of the pixel PX1 shown in FIG. 12. The second electrode D7 is connected to the second electrode D6 of the sixth transistor T6. The first electrode S7 and the second electrode D7 may be provided on the semiconductor layer 130.

The storage capacitor Cst includes a first storage electrode E1 and a second storage electrode E2 overlapping with the second gate insulating layer 112 therebetween. The second storage electrode E2 corresponds to the driving gate electrode 155 of the driving transistor T1, and the first storage electrode E1 is an overlapping portion 126b of the storage electrode 126. Here, the second gate insulating layer 112 becomes a dielectric material, and capacitance is determined by charges stored in the storage capacitor Cst and the voltage between the first and second storage electrodes E1 and E2. By using the driving gate electrode 155 as a second storage electrode E2, a space for forming the storage capacitor Cst may be obtained in the space narrowed by the channel of the driving transistor T1 occupying a large area in the pixel.

The first storage electrode E1 is connected to the expansion 164a of the horizontal driving voltage line 164 through the opening 56, and the expansion 164a of the horizontal driving voltage line 164 is connected to the driving voltage line 172 through the opening 72. Therefore, the storage capacitor Cst stores charges corresponding to a difference between the driving voltage ELVDD transmitted to the first storage electrode E1 through the driving voltage line 172 and the gate voltage (Vg) of the driving gate electrode 155.

The pixel electrode connector 174 is connected to a pixel electrode (not shown) referred to as an anode through the opening 81. Further, the pixel electrode connector 174 is connected to the repair connector 167 through the opening 73. Accordingly, when the portion where the repair line 124 overlaps the repair connector 167 is short-circuited by a laser process, for example, the driving voltage ELVDD may be applied to the organic light emitting diode OLED by transmitting the driving voltage ELVDD to the repair line 124.

An organic light emitting diode display according to a stacking order will now be described.

Referring to FIGS. 12 to 14, the organic light emitting diode display forms semiconductor layers 130 and 131, first gate conductive layers 153, 155, 156, 157, and 158, second gate conductive layers 124 and 126, first source drain conductive layers 161, 162, 163, 164, 165, 166, and 167, and second source drain conductive layers 171, 172, and 173 on the substrate 110, and the layers are insulated from each other by an insulating layer between respective layers as long as they are not connected to each other through the opening. Here, the first gate conductive layer will be referred to as a first conductive layer, the second gate conductive layer will be referred to as a second conductive layer, the first source drain conductive layer will be referred to as a third conductive layer, the second source drain conductive layer will be referred to as a fourth conductive layer, the first gate insulating layer will be referred to as a first insulating layer, the second gate insulating layer will be referred to as a second insulating layer, and the interlayer insulating layer will be referred to as a third insulating layer. Further, the first insulating layer, the second insulating layer, and the interlayer insulating layer configure an inorganic insulating layer.

The substrate 110 includes a flexible substrate including plastic or polyimide (PI). In exemplary embodiments, it may include a glass substrate, and an inorganic insulating layer may be disposed on the substrate.

Semiconductor layers 130 and 131 are disposed on the substrate 110.

The semiconductor layer 130 includes an oxide semiconductor, and includes channels of the first to seventh transistors T1, T2, T3, T4, T5, T6, and T7. The semiconductor layer 132 of FIG. 13 shows a semiconductor of the driving transistor T1, and a semiconductor layer 136 of FIG. 14 shows a semiconductor of the sixth transistor T6.

The first gate insulating layer 111 is covered on the semiconductor layer 130 and the substrate 110, and the first gate insulating layer 111 includes an inorganic insulating material.

First gate conductive layers 153, 155, 156, 157, and 158 are disposed on the first gate insulating layer 111. The first gate conductive layers 153, 155, 156, 157, and 158 include an emission control signal line 153, a driving gate electrode 155, a third gate electrode 156, a fourth gate electrode 157, and a seventh gate electrode 158.

A second gate insulating layer 112 is covered on the first gate conductive layers 153, 155, 156, 157, and 158 and the first gate insulating layer 111, and the second gate insulating layer 112 includes an inorganic insulating material.

Second gate conductive layers 124 and 126 are disposed on the second gate insulating layer 112, and the second gate conductive layers 124 and 126 include a repair line 124 and a storage electrode 126.

An interlayer insulating layer 113 is covered on the second gate conductive layers 124 and 126 and the second gate insulating layer 112, and the interlayer insulating layer 113 includes an inorganic insulating material.

First source drain conductive layers 161, 162, 163, 164, 165, 166, and 167 are disposed on the interlayer insulating layer 113. The first source drain conductive layers 161, 162, 163, 164, 165, 166, and 167 include a scan line 161, a previous-stage scan line 162, a bypass control line 163, a horizontal driving voltage line 164, a data connector 165, a gate connector 166, and a repair connector 167.

A first organic layer 175 is covered on the first source drain conductive layers 161, 162, 163, 164, 165, 166, and 167 and the interlayer insulating layer 113, and the first organic layer 175 includes an organic material including polyimide (PI).

Second source drain conductive layers 171, 172, 173, and 174 are disposed on the first organic layer 175. The second source drain conductive layers 171, 172, 173, and 174 include a data line 171, a driving voltage line 172, an initialization voltage line 173, and a pixel electrode connector 174.

The second source drain conductive layers 171, 172, 173, and 174 include a triple-layered structure, and the driving voltage line 172 of FIG. 13 includes a lower layer 172a including a transparent conductive oxidization film, a middle layer 172b including aluminum, and an upper layer 172c including titanium. Further, the pixel electrode connector 174 of FIG. 14 is shown to include a lower layer 174a including a transparent conductive oxidization film, a middle layer 174b including aluminum, and an upper layer 174c including titanium.

A second organic layer 180 is disposed on the second source drain conductive layers 171, 172, 173, and 174 and the first organic layer 175, and the second organic layer 180 includes an organic material including polyimide (PI).

Although not shown in FIGS. 13 and 14, a pixel electrode (not shown) is provided on the second organic layer 180, and the pixel electrode may be connected to the second source drain conductive layers 171, 172, 172, 173, and 174 through a contact hole defined in the second organic layer 180.

A partition (not shown) may be provided on the second organic layer 180 and the pixel electrode. The partition includes an opening portion overlapping the pixel electrode, and an organic emission layer may be provided in the opening portion.

A common electrode (not shown) may be provided on the organic emission layer and the partition. The pixel electrode, the organic emission layer, and the common electrode configure an organic light emitting diode OLED. When holes and electrons are injected into the organic emission layer from the pixel electrode and the common electrode in the organic light emitting diode OLED, excitons that are combination of the injected holes and electrons emit light when transiting to the ground state from the excited state.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. A method for manufacturing an organic light emitting diode display, the method comprising:
   providing a substrate;
   forming an inorganic insulating layer on the substrate;
   forming a third conductive layer on the inorganic insulating layer;
   forming a first organic layer on the third conductive layer;

forming a fourth conductive layer on the first organic layer, the forming the fourth conductive layer further includes forming a plurality of metal layers, and the plurality of metal layers is etched by a dry etching process to form a middle layer and an upper layer of the fourth conductive layer;

forming a second organic layer on the first organic layer to cover the fourth conductive layer; and forming an anode on the second organic layer, wherein the fourth conductive layer is connected between the third conductive layer and the anode, and wherein the forming the fourth conductive layer includes at least one of the dry etching process and a wet etching process.

2. The method of claim 1, wherein
the forming the fourth conductive layer further includes:
forming a transparent conductive oxidization film on the first organic layer; and
forming the plurality of metal layers on the transparent conductive oxidization film.

3. The method of claim 2, wherein
the transparent conductive oxidization film is etched by the wet etching process to thus form a lower layer of the fourth conductive layer.

4. The method of claim 3, wherein
the transparent conductive oxidization film includes at least one of indium tin oxide ("ITO"), indium zinc oxide ("IZO"), indium gallium zinc oxide ("IGZO"), and indium tin zinc oxide ("ITZO"), and
the lower layer includes at least one of ITO, IZO, IGZO, and ITZO.

5. The method of claim 1, wherein
the plurality of metal layers includes at least one of aluminum (Al), titanium (Ti), and titanium nitride (TiN), the middle layer includes the aluminum, and
the upper layer further includes at least one of titanium and titanium nitride.

6. A method for manufacturing an organic light emitting diode display, the method comprising:
providing a substrate;
forming an inorganic insulating layer on the substrate;
forming a third conductive layer on the inorganic insulating layer;
forming a first organic layer on the third conductive layer;
forming a fourth conductive layer on the first organic layer;
forming a second organic layer on the first organic layer to cover the fourth conductive layer; and
forming an anode on the second organic layer,
wherein the fourth conductive layer is connected between the third conductive layer and the anode,
wherein the forming the fourth conductive layer includes at least one of a dry etching process and a wet etching process,
wherein between the providing the substrate and the forming the inorganic insulating layer on the substrate:
forming a semiconductor layer on the substrate;
forming a first insulating layer on the semiconductor layer;
forming a first conductive layer on the first insulating layer; and
forming a second insulating layer on the first conductive layer, and
wherein the inorganic insulating layer is disposed on the second insulating layer.

* * * * *